United States Patent
Kim et al.

(10) Patent No.: US 9,178,126 B2
(45) Date of Patent: Nov. 3, 2015

(54) THERMOELECTRIC ELEMENTS USING METAL-INSULATOR TRANSITION MATERIAL

(71) Applicant: Electronics and Telecommunications Research Institute, Daejeon (KR)

(72) Inventors: Hyun-Tak Kim, Daejeon (KR); Jeong Yong Choi, Daejeon (KR); Hyun-Woo Jeon, Seoul (KR); Jae ho Choi, Ulsan (KR); Gi-wan Seo, Incheon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 100 days.

(21) Appl. No.: 13/905,950

(22) Filed: May 30, 2013

(65) Prior Publication Data

US 2014/0007914 A1  Jan. 9, 2014

(30) Foreign Application Priority Data

Jul. 5, 2012  (KR) .................. 10-2012-0073434
Jan. 14, 2013  (KR) .................. 10-2013-0003890

(51) Int. Cl.
*H01L 35/30* (2006.01)
*H01L 35/12* (2006.01)
*H01L 35/20* (2006.01)
*H01L 35/22* (2006.01)

(52) U.S. Cl.
CPC ................ *H01L 35/12* (2013.01); *H01L 35/20* (2013.01); *H01L 35/22* (2013.01)

(58) Field of Classification Search
None
See application file for complete search history.

(56) References Cited

U.S. PATENT DOCUMENTS

| | | | | |
|---|---|---|---|---|
| 5,264,075 | A * | 11/1993 | Zanini-Fisher et al. | 438/53 |
| 2005/0145163 | A1 * | 7/2005 | Matsuki et al. | 117/68 |
| 2005/0260486 | A1 * | 11/2005 | Cho et al. | 429/62 |
| 2008/0297358 | A1 * | 12/2008 | Kim et al. | 340/595 |
| 2010/0071751 | A1 * | 3/2010 | Kim et al. | 136/244 |
| 2011/0235390 | A1 * | 9/2011 | Barwicz et al. | 365/148 |
| 2012/0235038 | A1 * | 9/2012 | Nishikawa et al. | 250/338.3 |

FOREIGN PATENT DOCUMENTS

| | | |
|---|---|---|
| KR | 10-2007-0040709 A | 4/2007 |
| KR | 10-2007-0115571 A | 12/2007 |

* cited by examiner

*Primary Examiner* — Eli Mekhlin

(57) ABSTRACT

Provided is a thermoelectric device including a first electrode, a substrate electrically connected to the first electrode, a thin film on the substrate, and a second electrode on the thin film. The substrate and the thin film may be configured to exhibit a metallic property at a temperature over a critical temperature, thereby having a thermoelectric power of the device that is higher than that of a semiconductor junction.

13 Claims, 10 Drawing Sheets

THERMOELECTRIC ELEMENTS USING METAL-INSULATOR TRANSITION MATERIAL

CROSS-REFERENCE TO RELATED APPLICATIONS

This U.S. non-provisional patent application claims priority under 35 U.S.C. §119 to Korean Patent Application Nos. 10-2012-0073434 and 10-2013-0003890, filed on Jul. 5, 2012 and Jan. 14, 2013, respectively, in the Korean Intellectual Property Office, the entire contents of which are hereby incorporated by reference.

BACKGROUND OF THE INVENTION

Example embodiments of the inventive concept relate to a thermoelectric device, and in particular, to thermoelectric elements using a metal-insulator-transition metal.

Thermoelectric devices, as one of clean energy production technologies, have been suggested to produce electricity from waste heat. Conventionally, the thermoelectric devices have been realized using a semiconductor pn junction. The thermoelectric device may convert thermal energy into electric energy using Seeback Effect. Alternatively, the thermoelectric device may increase or decrease a temperature thereof using Peltier Effect, when an external voltage is applied thereto. Thermoelectric efficiency of the thermoelectric devices may be expressed by $ZT=(S2s/k)T$, where S is a Seeback coefficient, s is electric conductivity, k is thermal conductivity, and T is a measurement temperature. For example, ZT coefficients of 1 and 2 may represent efficiencies of about 10% and 20%, respectively. It has been known that a super lattice structure of $Bi2Te3/Sb2Te3$ has ZT of 2.5. Junctions made of ceramics p-Si and n-Si are being commercialized as thermoelectric elements. In the meantime, when a car is running, its radiator may be heated up to a temperature of 200° C. In addition, there is a large amount of waste heat of 100° C. near boiler. This means that there is an increasing demand for thermoelectric device efficiently harvesting waste heat of about 200° C. or less.

SUMMARY

Example embodiments of the inventive concept provide a thermoelectric device using a metal-insulator transition (MIT) material.

Other example embodiments of the inventive concept a thermoelectric device capable of realizing efficiency higher than that of semiconductor thermoelectric elements.

According to example embodiments of the inventive concepts, a thermoelectric device may include a first electrode, a substrate electrically connected to the first electrode, a thin film on the substrate, and a second electrode on the thin film. The substrate and the thin film may be configured to exhibit a metallic property at a temperature over a critical temperature, thereby having a thermoelectric power of the device that is higher than that of a semiconductor junction. In addition, as the result of the metallic property, a difference in work-function between the substrate and the thin film may be increased with increasing temperature. The substrate and the thin film may be configured to exhibit a metal-insulator transition (MIT) metal property, and have more carriers than a semiconductor and have an improved thermoelectric property.

In example embodiments, the substrate may include silicon. The silicon layer may be doped with conductive impurities. The conductive impurities acceptors, which are one of boron or gallium, or donors, which are one of the arsenic and the phosphorus. A concentration of the acceptors or the donors in the silicon layer may be about $10^{18}$ $cm^{-3}$. In example embodiments, the thin film may include a metal-insulating transition (MIT) material. The MIT material may include a vanadium oxide of $VO_2$ or $V_2O_3$. The vanadium oxide of $VO_2$ exhibits the metallic property at 67° C., and the vanadium oxide of $V_2O_3$ exhibits the metallic property at 150 K.

In example embodiments, the metallic property may be an electric property measured from a thermoelectric current and a thermal voltage between the MIT material and the substrate.

In example embodiments, the thin film may include a strongly-correlated metal. For example, the strongly-correlated metal may include $YBa_2Cu_3O_7$ or $MgB_2$.

In example embodiments, the thin film include at least one of a) inorganic semiconductor materials with low concentration of holes and insulating materials, b) organic semiconductor materials with low concentration of holes and insulating materials, c) semiconductor materials with low concentration of holes, or d) oxide semiconductor materials with low concentration of holes and insulating materials, and the inorganic semiconductor materials may include at least one of oxygen, carbon, III-V compound semiconductors, II-VI compound semiconductors, transition metal materials, rare earth materials, or lanthanum-based materials In example embodiments, the first electrode may be provided on or below the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
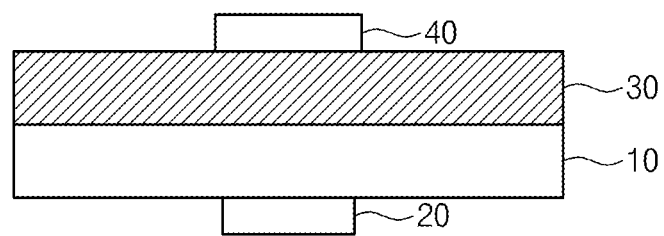
FIGS. 1 and 2 are sectional views illustrating a thermoelectric device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
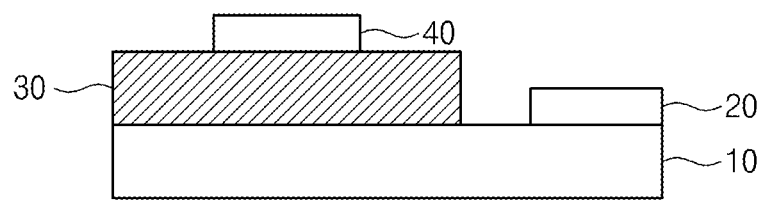

FIGS. 1 and 2 are sectional views illustrating a thermoelectric device according to example embodiments of the inventive concept.

Referring to FIGS. 1 and 2, a thermoelectric device may include a substrate 10, a first electrode 20, a thin film 30, and a second electrode 40.

The first electrode 20 and the second electrode 40 may include a metal, such as gold (Au), silver (Ag), copper (Cu), aluminum (Al), tungsten (W), or zinc (Zn). The first electrode 20 may be provided on or below the substrate 10. The first electrode 20 and the second electrode 40 may be electrically connected to each other via the substrate 10 and the thin film 30. The first electrode 20 may be spaced apart from the thin film 30 and the second electrode 40. The second electrode 40 may be provided on the thin film 30.

The substrate 10 may include p- or n-type crystalline silicon exhibiting a conductive property. For example, the substrate 10 may be doped with acceptors (e.g., boron or gallium) to have a p-type conductivity. In other example embodiments, the substrate 10 may be doped with donors (e.g., arsenic or phosphorus) to have an n-type conductivity. The acceptors or the donors in crystalline silicon may be doped to have a low concentration of about $10^{18}$ EAcm$^{-3}$. This may correspond to a critical value for MIT to occur in a material, and for a Mott material, the critical carrier concentration, n, is $(0.25/a_H)^{(-1/3)}=10^{18}$ cm$^{-3}$, where $a_H$ represents a radius of hydrogen atom.

The thin film 30 may include at least one of metal-insulator transition (MIT) materials, such as $VO_2$ and $V_2O_3$. For example, $VO_2$ and $V_2O_3$ may have a metallic property at a temperature higher than critical temperatures thereof.

Figure 3:
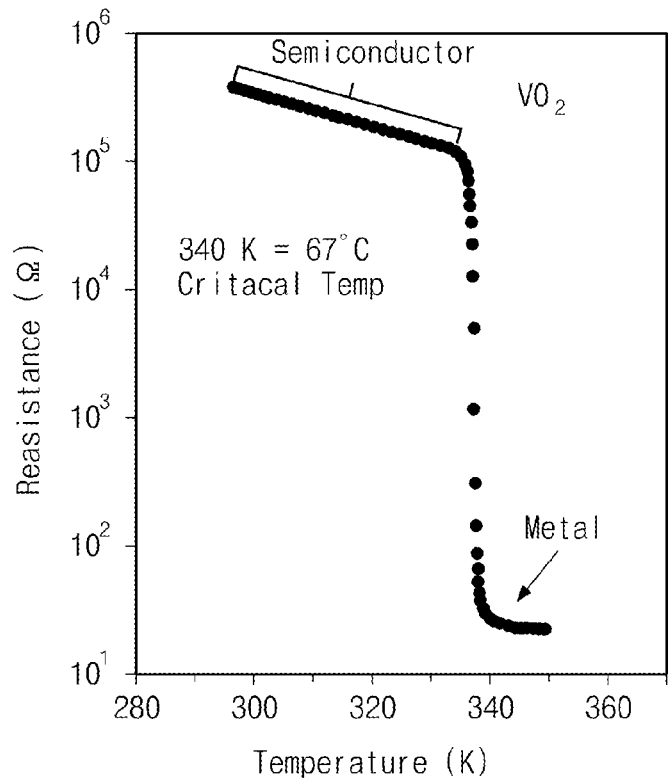
FIGS. 3 and 4 are graphs showing metal-insulator transition characteristics of $VO_2$ and $V_2O_3$.
Figure 4:
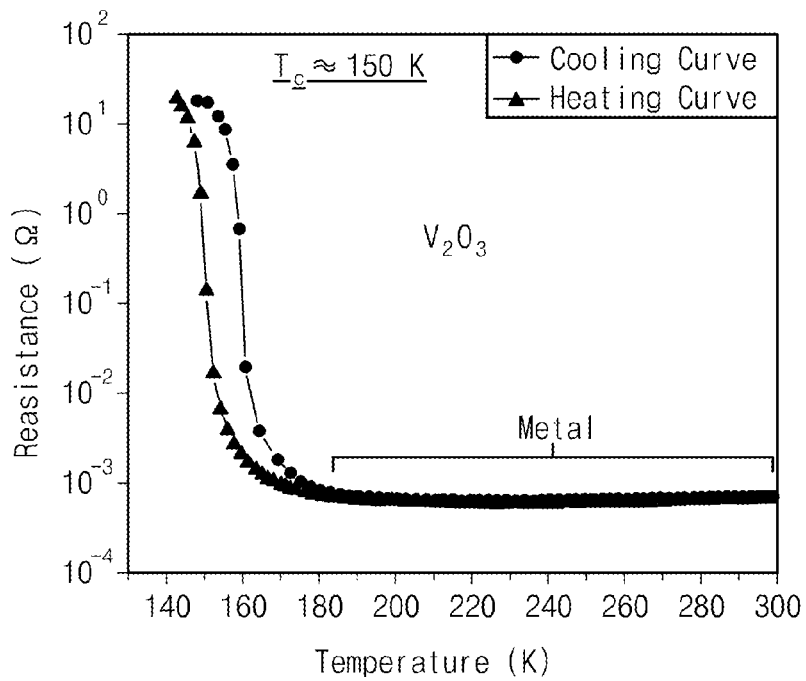

FIGS. 3 and 4 are graphs showing metal-insulator transition characteristics of $VO_2$ and $V_2O_3$.

Referring to FIGS. 3 and 4, a resistance of a metal-insulator transition material may be abruptly decreased at its critical temperature. $VO_2$ is a typical MIT material exhibiting a large resistance change at a critical temperature of about 67° C. or 340K and exhibiting a metallic property at a temperature over the critical temperature, as shown in FIG. 3. $V_2O_3$ is a MIT material exhibiting a large resistance change at a critical temperature of about 150K and exhibiting a metallic property at a temperature over the critical temperature, as shown in FIG. 4. The thin film 30 may have a thickness of about 90 nm or more. The thin film 30 and the substrate 10 may constitute a pn junction at a critical temperature or more. The junction made of the thin film 30 and the substrate 10 may have a work-function difference much higher than that of a semiconductor-based pn junction. In addition, the substrate 10 and the thin film 30 may exhibit a metallic property of a thermoelectric power higher than that of the semiconductor-based pn junction, at a critical temperature or more.

Figure 5:
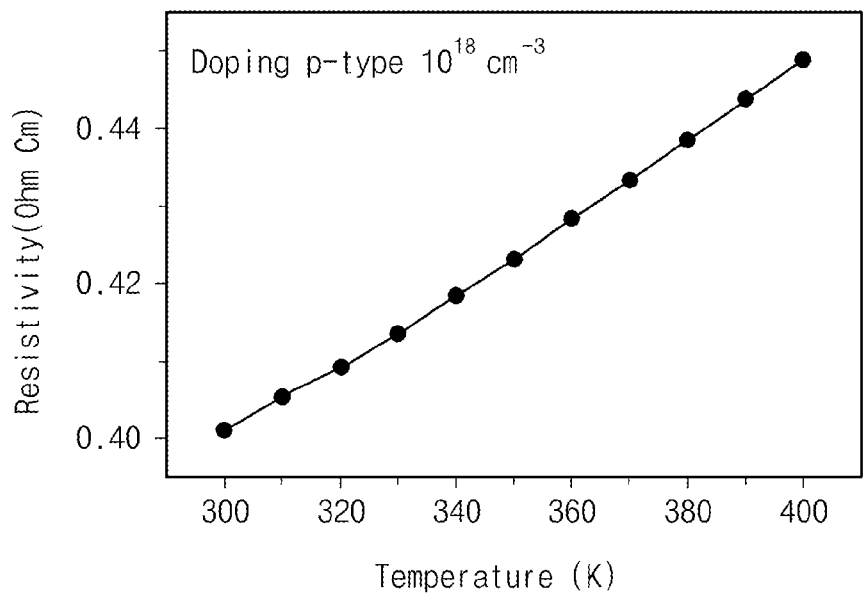
FIGS. 5 and 6 are graphs showing a metallic property of a crystalline silicon substrate.
Figure 6:
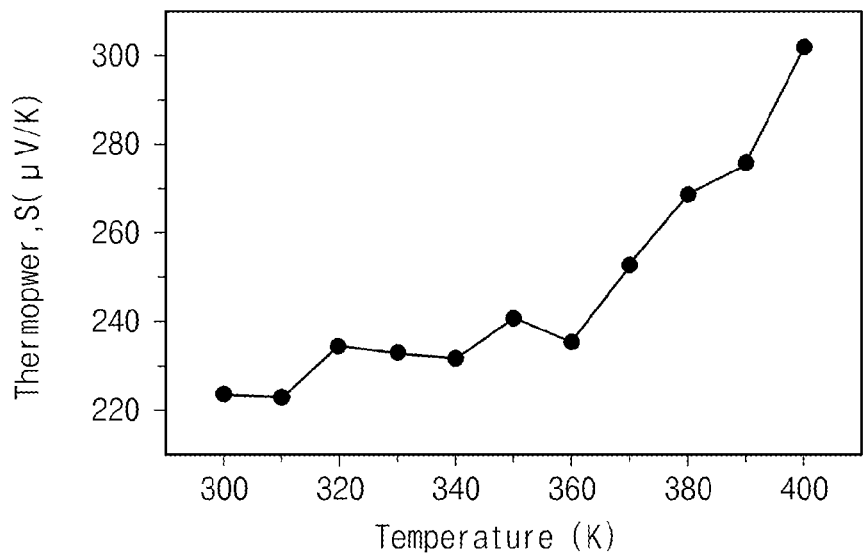

FIGS. 5 and 6 are graphs showing a metallic property of a crystalline silicon substrate.

Referring to FIGS. 5 and 6, for the substrate 10 of crystalline silicon, an electrical resistance, as shown in FIG. 5, and a thermoelectric power or a Seebeck coefficient, as shown in FIG. 6, may increase along with a temperature, similar to electrical characteristics of typical metals. This is a completely new feature of the crystalline silicon substrate 10 that was so far unknown, in that silicon has been known to have electric resistance decreasing with an increase of temperature. In other words, this MIT metal property may result from the fact that the crystalline silicon is doped with completely different carriers.

Figure 7:
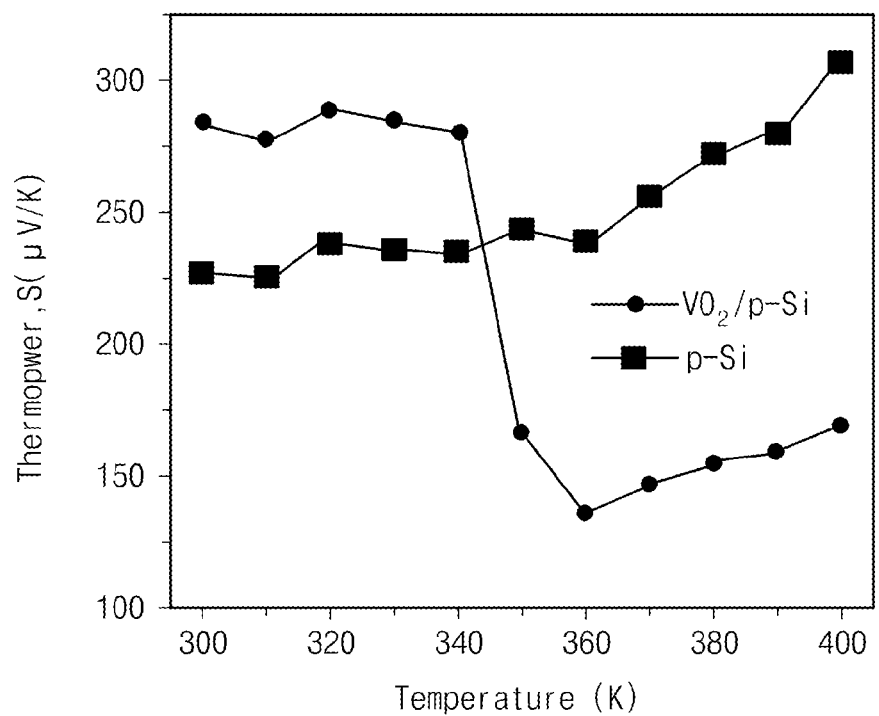
FIG. 7 is a graph showing thermoelectric power characteristics or Seebeck coefficient of $VO_2$ MIT thin film.

FIG. 7 is a graph showing thermoelectric power characteristics or Seebeck coefficient of $VO_2$ MIT thin film 30.

Referring to FIG. 7, the thin film 30 on the substrate 10 exhibits high thermoelectric power or high Seebeck coefficient S at a temperature over the MIT transition temperature. The Seebeck coefficient S is about 20-40 for typical metals, but was 150 or more at a temperature over 360K for this.

Figure 8:
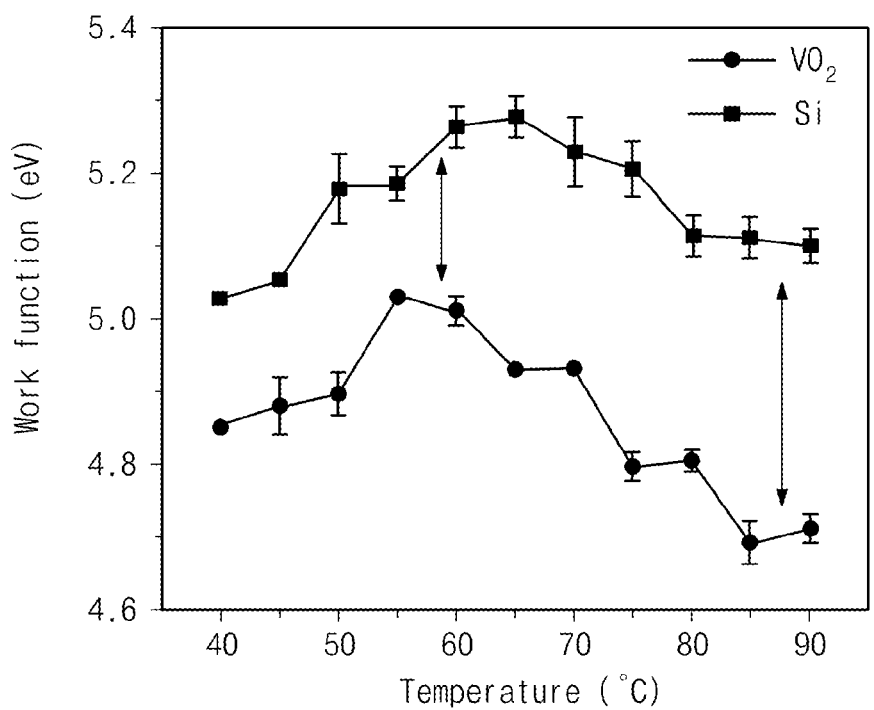
FIG. 8 is a graph showing a change in workfunction over temperature.

FIG. 8 is a graph showing a change in workfunction with temperature.

Referring to FIG. 8, in thermoelectric elements according to example embodiments of the inventive concept, a difference in work-function between the substrate 10 and the thin film 30 was increased with increasing temperature.

Figure 9:
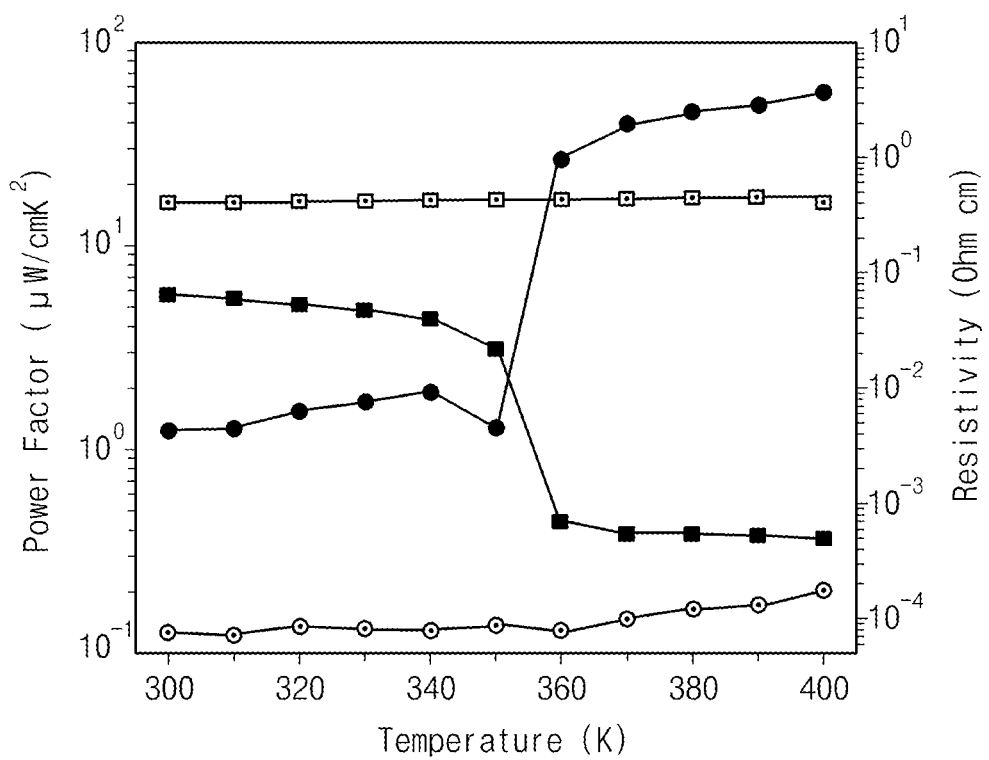
FIG. 9 is a graph showing power factors of a substrate and thin films.

FIG. 9 is a graph showing power factors of the substrate 10 and the thin film 30.

Referring to FIG. 9, the power factor was much higher than the known value. Power factor may be given by an equation $P=S^2/r$, where S and r are Seebeck coefficient and resistivity, respectively. A magnitude of the power factor may be used to evaluate characteristics of thin-film type thermoelectric elements. According to example embodiments of the inventive concept, a metallic substrate with p-type carriers and a metallic MIT thin film with n-type carriers may be combined to form a pn junction thermoelectric element. In certain embodiments, two metallic layers with carriers of the same type may be combined to form a junction-type thermoelectric element, in which a difference in workfunction between two metallic layers increases with increasing temperature. Such a junction-type thermoelectric element may be provided in a form of, for example, n-n junction a p-p junction.

Figure 10:
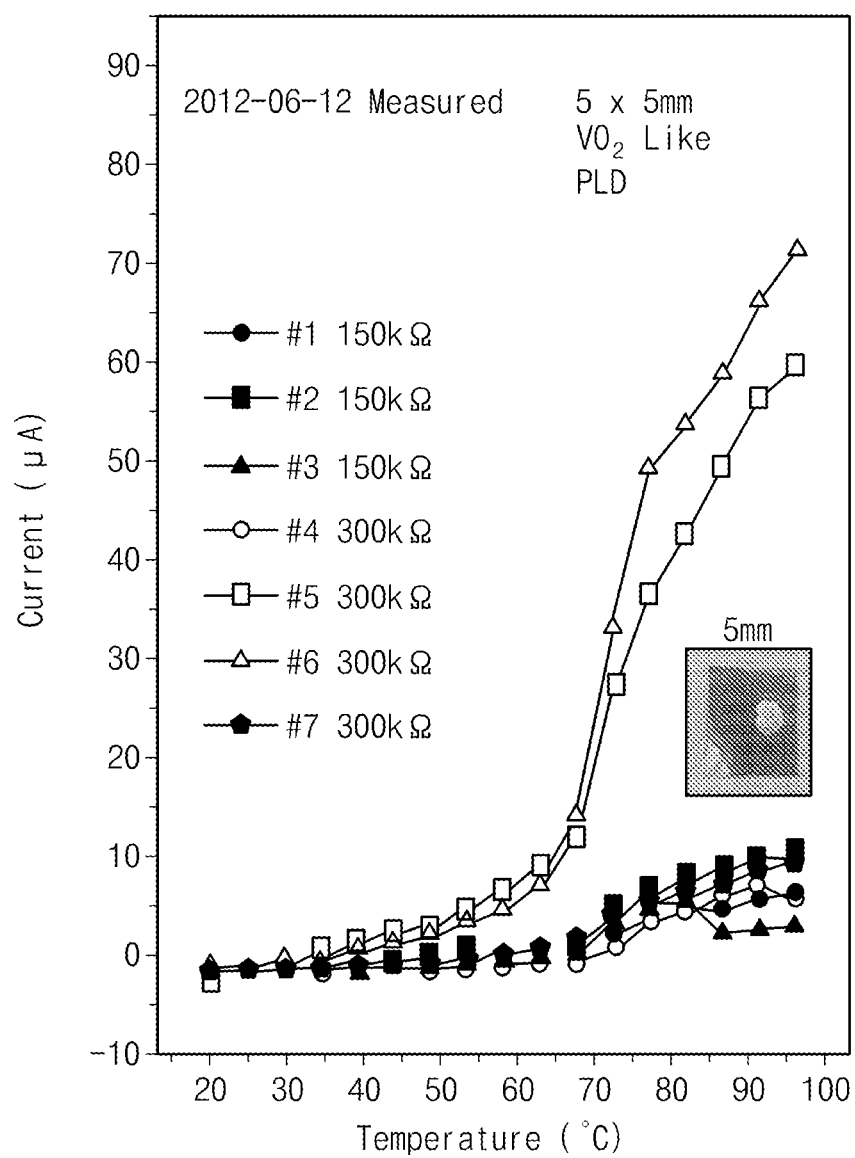
FIGS. 10 and 11 are graphs showing thermoelectric current and thermal voltage characteristics of a thermoelectric device with MIT thin film of $VO_2$.
Figure 11:
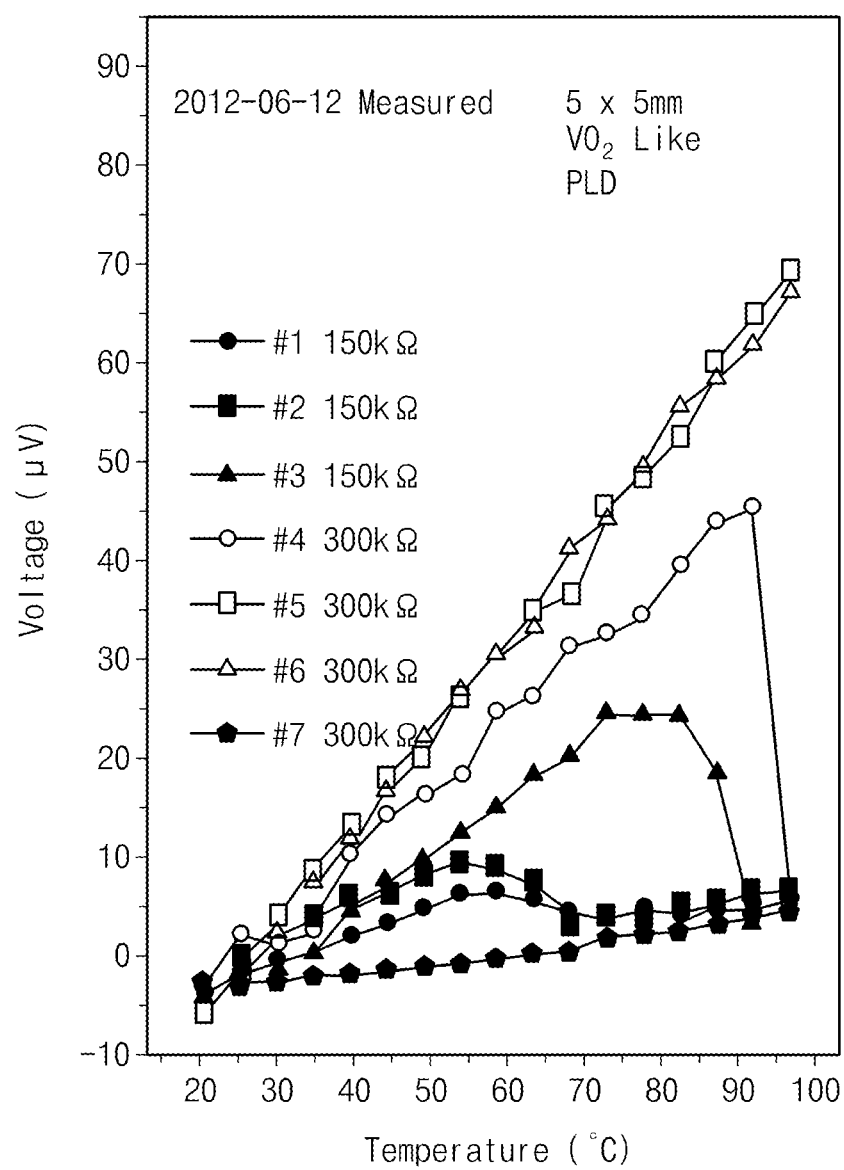

FIGS. 10 and 11 are graphs showing thermoelectric current and thermal voltage characteristics of a thermoelectric device with the MIT thin film 30 of $VO_2$.

Referring to FIGS. 10 and 11, thermoelectric currents were significantly increased at about 70° C. Thermal voltages were increased for high resistance and decreased for low resistance. Here, the substrate 10 was doped with p-type conductive impurities to have a low concentration of about $10^{18} EAcm^{-3}$. The $VO_2$ thin film 30 had a thickness of about 100 nm and an area of 5×5 mm². Referring to FIGS. 10 and 11, powers (i.e., I×V) of samples 6 and 7 were 1.12 mW/cm² and 1.00 mW/cm², respectively, at a high temperature of 100° C.

Although not shown, at a temperature of 270° C., the thermoelectric power of the $VO_2$ MIT device was measured to have about 240 mW/cm², and this value was much higher that 0.441 mW/cm², known as the highest power so far, of Bi—Sb—Te thin film. This result shows that MIT thermoelectric elements using MIT metal is much more effective than semiconductor thermoelectric elements.

Figure 12:
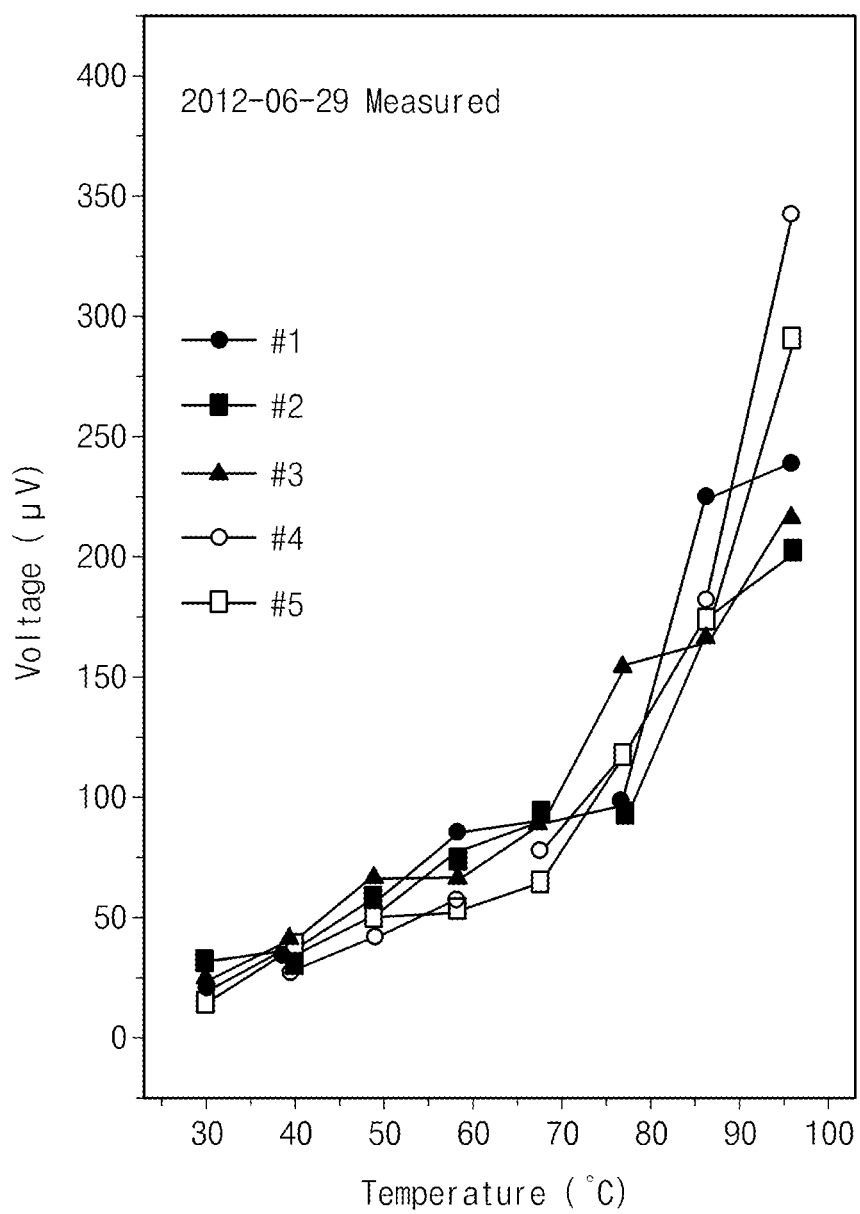
FIGS. 12 and 13 are graphs showing thermoelectric current and thermal voltage characteristics of a thermoelectric device with MIT thin film of $V_2O_3$.
Figure 13:
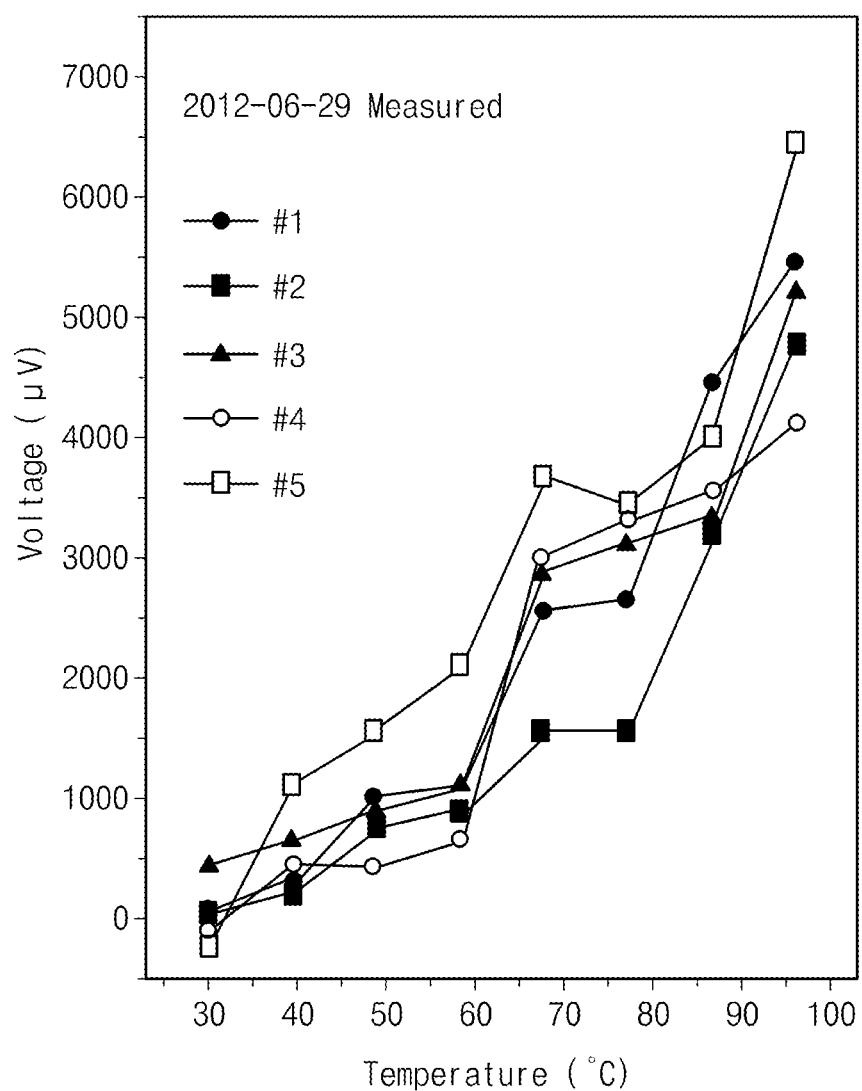

FIGS. 12 and 13 are graphs showing thermoelectric current and thermal voltage characteristics of a thermoelectric device with the MIT thin film 30 of $V_2O_3$.

Referring to FIGS. 12 and 13, thermoelectric currents were significantly increased at about 85° C. Thermal voltages were increased with increasing temperature. Similarly, the thin film 30 had an area of 5×5 cm². Powers (i.e., I×V) of samples 4 and 5 were 6.93 mW/cm² and 8.68 mW/cm², respectively, at a high temperature of 100° C.

Figure 14:
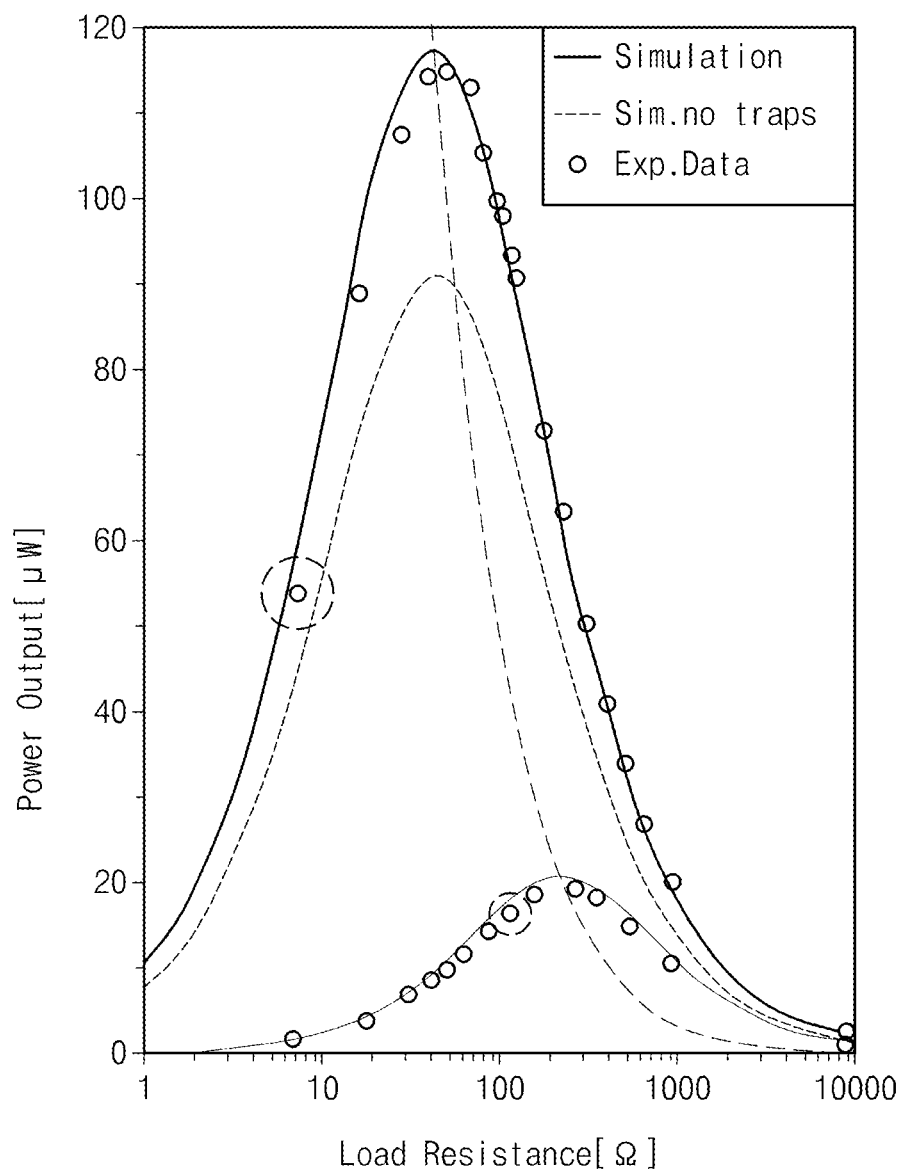
FIG. 14 is a graph showing electric power characteristics of the conventional pn junction of crystalline silicon.

FIG. 14 is a graph showing electric power characteristics of the conventional pn junction of crystalline silicon. For a conventional silicon pn junction, a thermoelectric power was 0.03 mW/cm² at 535K and 0.19 mW/cm² at 596K. An n-type silicon thin film provided on a p-type silicon substrate was used for the silicon pn junction. The silicon substrate and the silicon thin film had an area of 30×20 mm². As described above, the junction made of silicon and MIT material had a thermoelectric power of 1.0 mW/cm² or more.

In this sense, the thermoelectric device according to example embodiments of the inventive concept is definitely superior to the silicon thermoelectric device in terms of thermoelectric power characteristics. In example embodiments, to achieve an increased current and an increased voltage and to harvest waste heat, a plurality of thermoelectric devices may be connected in parallel or in series to each other.

Referring back to FIGS. 1 and 2, the thin film 30 may include a superconductivity material, e.g., $YBa_2Cu_3O_7$, $MgB_2$, which is known as a strongly-correlated metal exhibiting a metallic property at a low temperature lower than the room temperature.

Alternatively, the thin film 30 may include at least one of a) inorganic semiconductor materials with low concentration of holes and insulating materials, b) organic semiconductor materials with low concentration of holes and insulating materials, c) semiconductor materials with low concentration of holes, or d) oxide semiconductor materials with low concentration of holes and insulating materials. In example embodiments, the inorganic semiconductor materials may include at least one of oxygen, carbon, III-V compound semiconductors, II-VI compound semiconductors, transition metal materials, rare earth materials, or lanthanum-based materials.

According to example embodiments of the inventive concept, a thin film of MIT material may be provided on a doped silicon substrate. The doped silicon substrate and the MIT thin film may exhibit a thermoelectric power and/or a metallic property that is superior to a semiconductor pn junction, at a high temperature (e.g., over the room temperature). For example, the junction with the silicon substrate and the MIT thin film may have a high thermoelectric power of 1.0 mW/cm² or more, while a typical silicon-based pn junction has a low thermoelectric power of 0.1 mW/cm² or less.

In this sense, the thermoelectric device according to example embodiments of the inventive concept can be operated with higher efficiency than conventional thermoelectric elements using a semiconductor pn junction.

While example embodiments of the inventive concepts have been particularly shown and described, it will be understood by one of ordinary skill in the art that variations in form and detail may be made therein without departing from the spirit and scope of the attached claims.

What is claimed is:

1. A thermoelectric device, comprising:
a first electrode;
a substrate disposed directly on the first electrode;
a thin film disposed directly on the substrate; and
a second electrode disposed directly on the thin film,
wherein the thin film comprises a metal-insulating transition (MIT) material, and
wherein the substrate and the thin film are configured in such a way that majority carriers thereof have types different from each other.

2. The device of claim 1, wherein the substrate is doped with conductive impurities, and wherein the conductive impurities include acceptors, which are one of boron or gallium, or donors, which are one of arsenic and phosphorus.

3. The device of claim 1, wherein the MIT material comprises a vanadium oxide of $VO_2$ or $V_2O_3$.

4. The device of claim 3, wherein a metallic property is an electric property measured from a thermoelectric current and a thermal voltage between the thin film and the substrate.

5. The device of claim 3, wherein the vanadium oxide of $VO_2$ exhibits a metallic property at 67° C.

6. The device of claim 1, wherein the MIT material includes a vanadium oxide of $VO_2$, and wherein the thin film has a thickness of about 100 nm.

7. The device of claim 1, wherein the MIT material includes a vanadium oxide of $V_2O_3$, and wherein the thin film includes a top surface having an area of about 25 $mm^2$.

8. The device of claim 1, wherein the substrate comprises silicon doped with conductive impurities and a concentration of the conductive impurities is about $10^{18}$ $cm^{-3}$.

9. A thermoelectric device comprising:
a substrate;
a first electrode disposed directly on the substrate;
a thin film disposed directly on the substrate and separated from the first electrode; and
a second electrode disposed directly on the thin film,
wherein the thin film comprises a metal-insulating transition (MIT) material, and
wherein the substrate and the thin film are configured in such a way that majority carriers thereof have types different from each other.

10. The device of claim 9, wherein a bottom surface of the first electrode is coplanar with a bottom surface of the thin film.

11. The device of claim 9, wherein the substrate comprises silicon that is doped with impurities and a concentration of the impurities is about $10^{18}$ $cm^{-3}$.

12. The device of claim 11, wherein the MIT material includes a vanadium oxide of $VO_2$, and wherein the thin film has a thickness of about 100 nm.

13. The device of claim 9, wherein the MIT material includes a vanadium oxide of $V_2O_3$, and wherein the thin film includes a top surface having an area of about 25 $mm^2$.

* * * * *